(12) United States Patent
Ping et al.

(10) Patent No.: US 6,399,983 B1
(45) Date of Patent: Jun. 4, 2002

(54) REDUCTION OF SHORTS AMONG ELECTRICAL CELLS FORMED ON A SEMICONDUCTOR SUBSTRATE

(75) Inventors: Er-Xuan Ping; Ying Huang, both of Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/389,294

(22) Filed: Sep. 2, 1999

(51) Int. Cl.[7] .......................................... H01L 21/8242
(52) U.S. Cl. ...................... 257/309; 438/253; 257/306
(58) Field of Search ................................ 257/306, 309; 438/253

(56) References Cited

U.S. PATENT DOCUMENTS

| | | | | |
|---|---|---|---|---|
| 5,357,132 A | * | 10/1994 | Turner | |
| 5,621,606 A | * | 4/1997 | Hwang | |
| 5,830,793 A | | 11/1998 | Schuegraf et al. | |
| 5,847,424 A | * | 12/1998 | Kang | |
| 5,994,197 A | * | 11/1999 | Liao | |
| 6,028,334 A | * | 2/2000 | Sumitami | |
| 6,077,743 A | * | 6/2000 | Chen | |

* cited by examiner

*Primary Examiner*—Wael Fahmy
*Assistant Examiner*—Joannie Adelle Garcia
(74) *Attorney, Agent, or Firm*—Knobbe, Martens, Olson & Bear, LLP

(57) ABSTRACT

An integrated circuit, such as a DRAM circuit, having a plurality of cells is formed in containers formed an isolation layer positioned on an first surface of a semiconductor substrate. The containers have a first region located proximal the first surface of the semiconductor substrate that has a first cross-sectional area and a second region located distal from the first surface of the semiconductor substrate that has a second cross-sectional area that is less than the first cross-sectional area. Cells, such as capacitors, are formed in the containers and the isolation material positioned between adjacent cells is removed so that a generally horizontal surface is formed. The horizontal surface is located closer to the first surface of the substrate than the transition between the first region and the second region of the container so that substantially vertical surfaces are formed in the isolation region linking the cells to the horizontal surface of the isolation layer. The addition of the vertical surfaces on the isolation region increases the surface path upon which leakage current will flow between adjacent cells thereby decreasing the likelihood of leakage currents travelling from one cell to an adjacent cell.

15 Claims, 4 Drawing Sheets

REDUCTION OF SHORTS AMONG ELECTRICAL CELLS FORMED ON A SEMICONDUCTOR SUBSTRATE

BACKGROUND OF THE INVENTION

1. Field of the Invention

The invention relates to silicon integrated circuit processing and, more particularly, to a process for reducing cell to cell shorts in integrated circuits.

2. Description of the Related Art

A continued increase in device packing density of integrated circuits requires a continued reduction in cell sizes without compromising device integrity. The trend toward smaller cell sizes in a densely packed circuit has invariably increased the occurrence of defects, such as cell to cell shorts. Cell to cell shorts occur when current from one cell strays to adjacent cells via a path along the surface of the isolation material between the cells, causing electrical bridging between two adjacent devices. This can result in damage to the adjacent cells or can hinder proper performance of the circuit.

The occurrence of cell to cell shorts is substantially more frequent in a densely packed circuit because the shortened distance between cells makes it much easier for the current to reach adjacent devices. In fact, this problem of cell to cell shorts is especially prevalent between capacitor cells in DRAM applications, particularly in DRAM circuits where the cells are positioned closer together to achieve greater scales of integration.

In particular, a DRAM cell typically consists of an access device, such as a transistor formed in a semiconductor substrate connected to a charge storage capacitor that is formed on top of the substrate adjacent the transistor such that the transistor can activate the capacitor. One typical capacitor configuration in a DRAM cell is similar in form to that of a container. To form the container shaped capacitor, two layers of conductive material, separated by a layer of dielectric, is deposited into an etched opening on one or more pre-deposited layers of isolation material, where the bottom of the openings exposes the access devices. The etched openings in the isolation material define a plurality of cell containers because they resemble, in shape and function, a container into which individual devices such as capacitors can be formed and isolated from each other.

The individual cell containers are typically arranged in an array on the substrate and are electrically separated from each other by the isolation material formed in between. Increased device packing density in DRAM cells requires cell containers to be placed closer together, with much less space separating individual devices, resulting in an increase of cell to cell shorts between adjacent devices, such as capacitors.

In addition to the shrinking distance between adjacent devices, cell to cell shorts can also occur as a consequence of a particular texturizing process used in manufacturing some DRAM cells. As it is understood in the art, each charge stored in a DRAM memory cell signifies a memory bit and increasing the amount of stored charge will enhance the memory function of the cell. Since the amount of charge a cell is able to store, i.e. the capacitance, varies directly with the surface area of the capacitor electrodes, any enhancement in cell capacitance typically involves increasing the electrode surface area.

As the packing density of cell capacitors has increased, the area allotted for each cell has diminished, yet the required cell capacitance has remained the same or even increased in some cases. It is therefore desirable to manufacture a capacitor with increased electrode surface area but without consuming additional cell space so that the cell capacitance can be increased despite of shrinking cell areas. One method of maintaining or increasing the electrode surface area in the face of shrinking cell space is to texturize the electrode surface.

One typical texturizing process comprises performing a seeding step in which nucleation sites are generated on the container shaped electrodes. Typically this is accomplished by depositing a material such as silicon on the substrate surface containing the electrodes, followed by an annealing process resulting in a textured electrode surface having a hemispherically grained morphology (HSG) as described, for example, in U.S. Pat. No. 5,830,793. The HSG textured electrodes have an enhanced surface area yet do not consume additional cell space. The HSG seeding process, however, frequently leaves conductive deposits such as polysilicon on the dielectric material between the electrodes, which in turn could potentially create a cell to cell short between neighboring electrodes in a densely packed circuit. Electrical shorts will occur more frequently as the polysilicon inadvertently deposited on the isolation material further facilitates the flow of current along an already shortened path between adjacent electrodes.

To reduce the occurrence of such cell to cell shorts, a post-etch process is typically used to remove the excess poly deposits on the dielectric surface. The post-etch process, however, not only requires additional resources and time during fabrication, but can also damage the textured electrodes by indiscriminately removing the polysilicon deposited on the electrodes along with the polysilicon found on the isolation material between the cells. Thus it is desirable to have a method of reducing the cell to cell shorts and, in particular, a method that does not compromise the textured electrode surfaces of DRAM cells.

Hence, from the foregoing, it will be appreciated that there is a need for a process for reducing shorts between adjacent cells on a semiconductor substrate that does not require additional processing steps. To this end, there is a particular need for a process of reducing shorts between adjacent capacitors on a DRAM memory circuit, and specifically texturized capacitors, that does not require additional potentially damaging etch steps.

SUMMARY OF THE INVENTION

The aforementioned needs are satisfied by the integrated circuit of the present invention. In one aspect, the present invention comprises a semiconductor substrate having a first surface with at least one isolation layer formed on the first surface of the substrate. The at least one isolation layer defines a plurality of cell containers that are located within the at least one isolation layer so that adjacent cell containers are at least a first distance apart. A plurality of cells are formed in the cell containers and the at least one isolation layer is contoured so that a surface path interconnecting adjacent cells of the plurality of cells is greater than the first distance. An increase in the surface path reduces the amount of leakage current travelling between adjacent cells.

In one embodiment, the cell containers are configured so as to have a first region of a first cross-sectional area located proximal the first surface of the substrate and a second region of a second cross-sectional area located distal from the first surface of the substrate. The second cross-sectional area is larger than the first cross-sectional area. In this embodiment, the at least one isolation layer is contoured so that a first surface of the at least one isolation layer located between adjacent cell containers is located in a plane that intersects the first region of the cell container. In this way, the surface path linking adjacent cells formed in adjacent cell containers includes one or more path lengths that extend inward towards the first surface and, thus, the surface path length for leakage currents between adjacent cells is increased.

In one particular embodiment, the cell containers can include capacitor cells. Moreover, in one embodiment, the isolation region can be contoured or formed so that the surface path between adjacent cells includes two paths lengths which are substantially perpendicular to the plane of the first surface of the semiconductor surface.

In another aspect of the present invention, a method of forming electrical cells on a semiconductor substrate is provided. The method comprises positioning at least one isolation layer on a first surface of the substrate, forming a plurality of cell containers in the at least one isolation layer so that the plurality of cell containers are at least a first distance apart, positioning cells in the plurality of cell containers so that the outer boundary of the cells conform to the inner surface of the cell containers, and contouring the at least one isolation layer between the plurality of cell containers so that a surface path for current to travel between the adjacent cells is greater than the first distance between the cell containers.

In one embodiment the cell containers are formed so that the cell containers include a first region and a second region located proximal the first surface of the substrate so that the first region has a first cross-sectional area and a second region located distal from the substrate has a second cross-sectional area greater than the first cross-sectional area. In this embodiment, the isolation layer is formed or contoured so that a first surface of the isolation layer between adjacent cells is located so as to be closer to the first surface of the substrate than a transition point between the first and second regions of the cell containers.

From the foregoing, it will be appreciated that the aspects of the present invention provide both a circuit and a method of fabricating electrical cells where the surface path between adjacent cells is increased. The increase in the surface path reduces leakage currents. As the surface path is increased due to contouring of the isolation layer, e.g., by etching or removing portions of the isolation layer, the decrease in the surface path can be achieved while reducing the risk of damage to the electrical cells. These and other objects and advantages of the present invention will become more apparent from the following description taken in conjunction with the following drawings.

DETAILED DESCRIPTION OF THE PREFERRED EMBODIMENTS

Reference will now be made to the drawings wherein like numerals refer to like parts throughout. As will be described hereinbelow, the process of the preferred embodiment provides a method of fabricating a DRAM memory array with an increased distance between adjacent cells while maintaining the same packing density, so as to reduce the occurrence of cell to cell shorts without consuming additional cell area.

Figure 1:
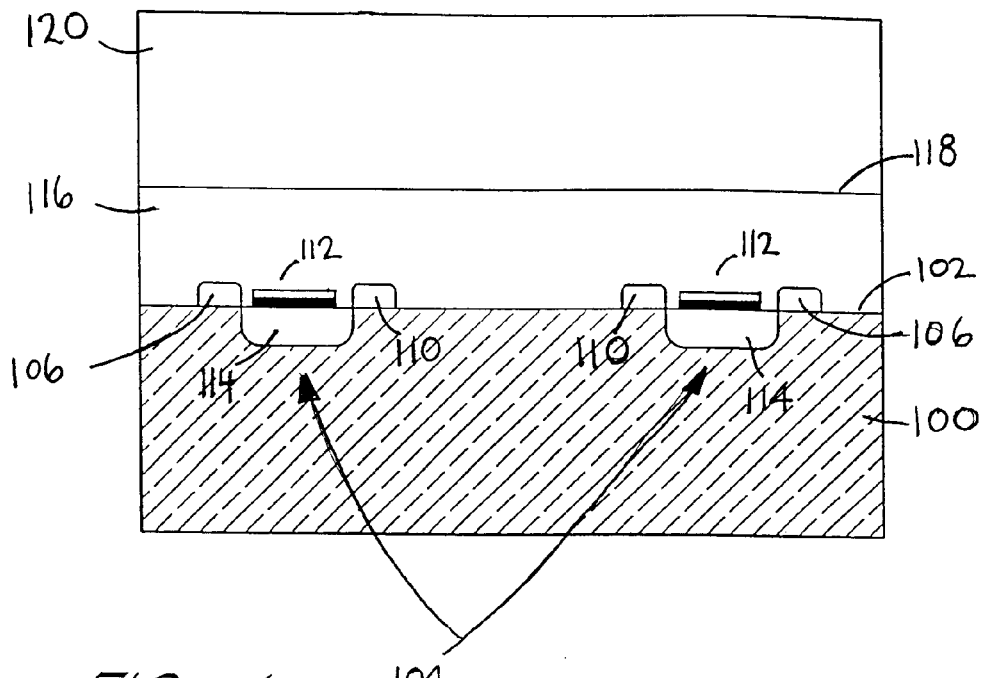
FIG. 1 is a partial schematic sectional view of conventionally formed access devices formed on a substrate with two layers of isolation material deposited over the substrate.

As shown in FIG. 1, an exemplary process of the illustrated embodiment begins with a clean first surface 102 of a substrate 100. As it is known in the art, the substrate 100 typically comprises a semiconductive material such as silicon, germanium, or gallium-arsenide. In this embodiment, a well-known silicon substrate 100, such as transmutation doped silicon, is used.

Additionally, as illustrated in FIG. 1, an array of access devices 104 is formed on top of the first surface 102 of the substrate 100. The access devices 104 in this embodiment comprise typical DRAM cell access devices, such as MOS transistors, having a source 106, a drain 110, and a gate structure 112 that regulates the current flow in a doped channel region 114 between the source 106 and the drain 110 in a well-known manner.

FIG. 1 further illustrates that a first isolation layer 116 is formed on the first surface 102 of the substrate 100. As it is known in the art, the first isolation layer 116 electrically isolates the individual access devices 104. In one embodiment, the first isolation layer 116 is comprised of a layer of tetraethyl orthosilicate (TEOS) that is about 7,000 Angstroms thick. TEOS is an oxide commonly used as dielectric material in integrated circuit fabrication and is deposited using well-known TEOS deposition techniques, such as chemical vapor deposition. As will be described in greater detail below, TEOS is used to form the first isolation layer 116 having a first removal characteristic such that it can be used as a resist or etch stop to facilitate removal of other outer layers of material.

As FIG. 1 illustrates, in addition to the first isolation layer 116, a second isolation layer 120 is formed on a second or outer surface 118 of the first isolation layer 116. In this embodiment, a layer of borophosphosilicate glass (BPSG) of approximately 7,000 Angstroms thick is deposited on the second surface 118 of the first isolation layer 116 to form the second isolation layer 120 using well-known deposition techniques, such as chemical vapor deposition. BPSG is another common dielectric material used in DRAM applications. Hence, in this embodiment, the first isolation layer 116 is first deposited onto the first surface 102 of the substrate 100, followed by a second isolation layer 120 being deposited onto the second surface 118 of the first isolation layer 116.

Figure 2:
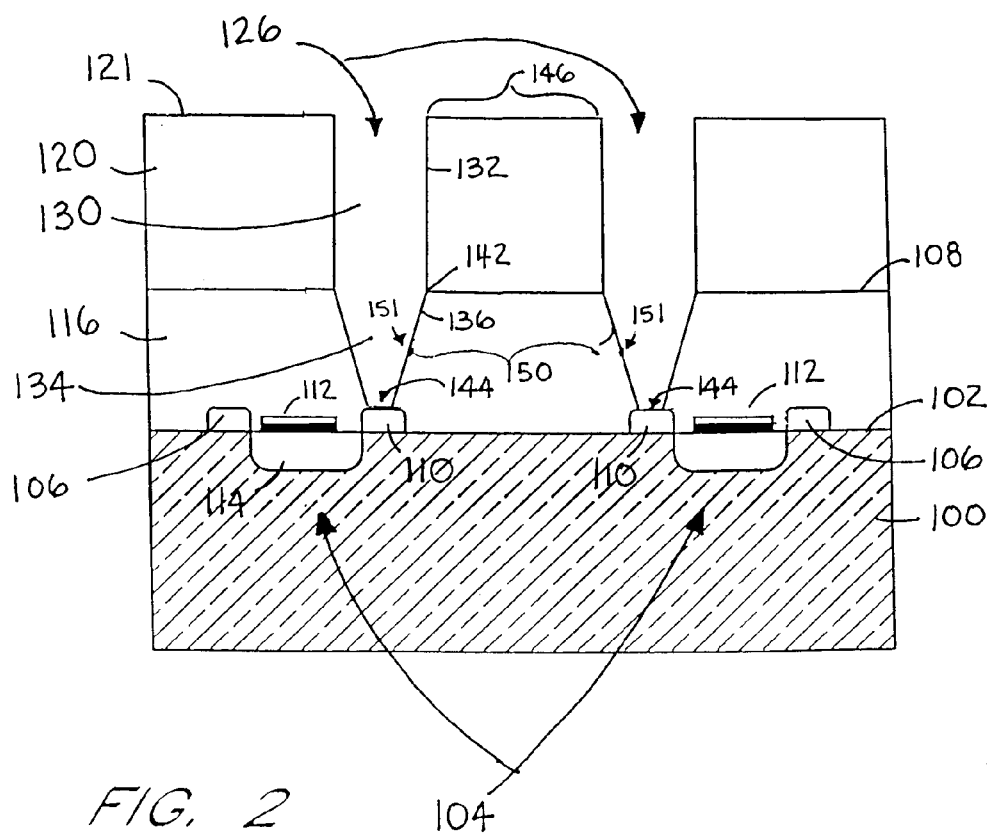
FIG. 2 is a partial schematic sectional view of one embodiment of the substrate of FIG. 1, which schematically illustrates openings formed in the isolation materials that will define cell containers.

As shown in FIG. 2, a plurality of openings defining a plurality of cell containers 126 are formed in the first isolation layer 116 and in the second isolation layer 120. In one embodiment, the cell containers 126 are formed using well-known patterning and etching techniques, such as photolithography, followed by selective etching of the isolation layers 120, 116 so as to produce cell containers 126 having the configuration shown in FIG. 2. The cell containers 126 are formed for subsequent capacitor cell formation, as will be described in greater detail below.

As illustrated in FIG. 2, the cell container 126 is defined by a second region 130 adjacent an outer surface 121 of the second isolation layer 120. The second region 130 of the cell container 126 comprises a second side wall 132 that is substantially perpendicular to the plane of the first surface 102 of the substrate 100. Preferably, the etch used to remove the second region 130 is a highly anisotropic etch, such as reactive ion etching, to obtain substantially perpendicular side walls 132. FIG. 2 further shows the cell container 126 comprising a first region 134 with a first side wall 136 having a tapered configuration.

The first side wall 136 begins to taper at a first transition point 142 between the second region 130 and the first region 134 and continues to narrow to where the first region 134 is adjacent to the drain 110 of each access device 104. In the embodiment shown in FIG. 2, the first transition point 142 occurs at the interface between the first isolation layer 116 and the second isolation layer 120. In this embodiment, the transition point 142 occurs at this location due to the difference in the removal characteristics between the first isolation layer 116 and the second isolation layer 120, as will be described in greater detail below. However, it will be appreciated that the transition point need not necessarily occur at the interface between different isolation layers. Rather, the transition point can occur at the change between a region of the cell container 126 that has a first configuration and a region of the cell container 126 that has a second, small configuration.

The tapering of the first side wall 136 allows the outer perimeter of the cell container 126 in the first region 134 to progressively decrease, ultimately resulting in a bottom section 144 of the cell container 126 having the smallest outer perimeter. A decrease in the outer perimeters of the cell containers 126 in the first region 134 increases the physical distance between adjacent cell containers 126 in the first region 134.

In particular, FIG. 2 illustrates that a second physical distance 150 between adjacent cell containers 126 along the tapered first side wall 136 of the first region 134 of the cell container 126 is greater than a first physical distance 146 along the substantially vertical second side wall 132 of the second region 130 of the cell container 126. Therefore, as will be described in greater detail below, the tapered configuration of the first side wall 136 allows for the creation of the longer physical distance 150 between adjacent cell containers 126 without sacrificing additional cell space.

In one embodiment, the cross-sectional area of the second region 130 of the cell container 126 is approximately 0.2 microns and the first region 134 is generally uniformly tapered such that the cross-sectional area of the first region 134 of the cell container immediately adjacent the access device 104 is 0.1 microns. Moreover, the increasing demands of higher density DRAM cells results in the openings defining the cell containers 126 to be positioned very close together, e.g., such that the physical distance 146 is 1000 Angstroms or less. The tapering of the first side wall 136 in the first region 134 results in the second physical distance 150 being between approximately 1200 and 1500 Angstroms. Preferably, the second physical distance 150 is the distance between two adjacent cell containers 126 measured between a point 151 on each container wherein the point 151 is located half way from the transition point 142 and the first surface 102 of the substrate 100.

As mentioned above, the difference in etching characteristics of the first isolation layer 116 and the second isolation layer 120 creates the transition point 142 where the first side wall 136 begins to taper. This increases the distance between adjacent inner surfaces of the cell container 126 which can be used to increase a surface conduction path for leakage currents between adjacent cells formed in the cell containers 126 as will be described in greater detail below.

Figure 3:
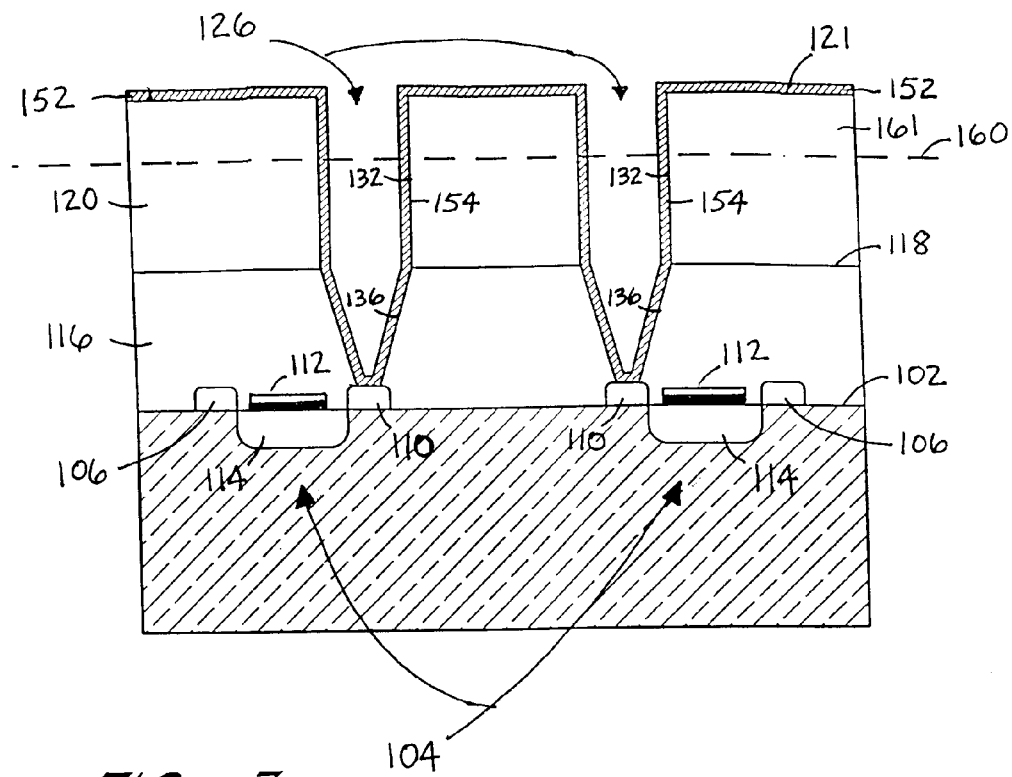
FIG. 3 is a partial schematic sectional view of the substrate of FIG. 2 which schematically illustrates the deposition of a polysilicon layer within the cell containers so as to form the bottom electrodes of capacitors formed in the cell container.

As illustrated in FIG. 3, following the formation of the cell container 126, a cell is then formed in the container 126. In this embodiment, a first conductive layer 152 is formed over the cell container 126, creating a first electrode 154 of a capacitor. The first electrode 154 is deposited so as to adhere in the side walls 132 and 136 of the cell container 126. Hence, the outer contours of the cell conforms to the inner walls of the cell container 126. As it is understood in the art, the electrode of a capacitor comprises a conductive material that is connected to an external access device, such as the drain 110 of a transistor, and is used for charge storage purposes.

In one embodiment, the first conductive layer 152, such as polysilicon, is deposited onto the cell container 126 using a process well known in the art such as chemical vapor deposition. The nature of the deposition process, however, will leave the first conductive layer 152 covering not only inside the cell container 126, but also covering the outer surface 121 of the second isolation layer 120. As such, the first conductive layer 152 formed on the outer surface 121 needs to be selectively removed so that each first electrode 154 in the containers 126 are electrically isolated from each other.

Figure 4:
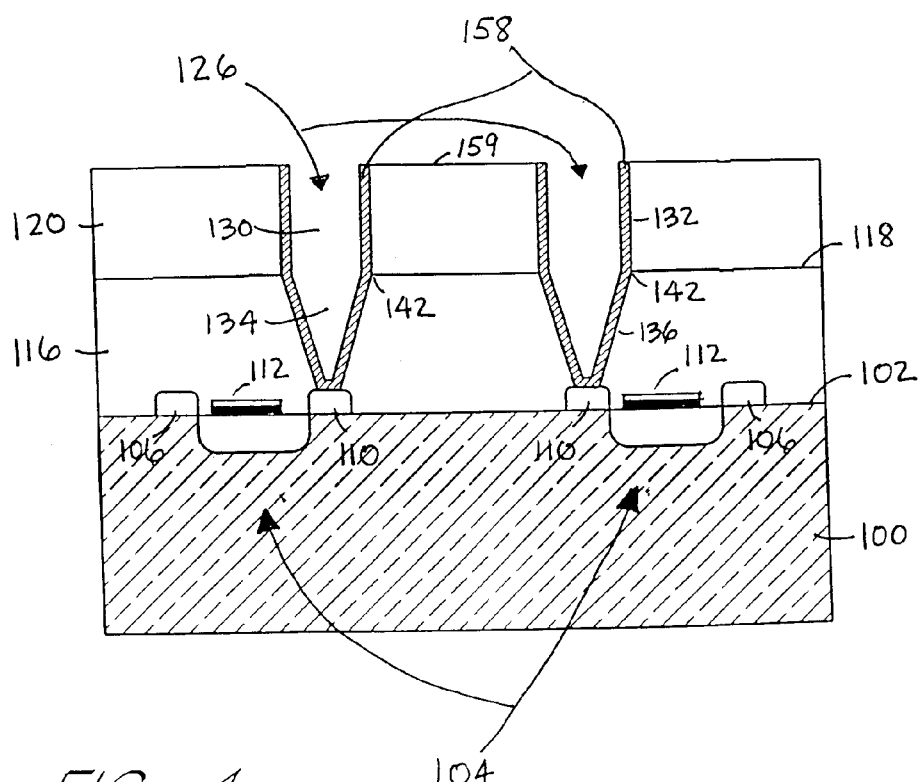
FIG. 4 is a partial schematic sectional view of the substrate of FIG. 3 which schematically illustrates the selective removal of residual conductive material and a portion of the isolation material.

Typically, the excess conductive material is removed using a well-known process, such as chemical mechanical polishing (CMP). As is shown in FIG. 3, all sections of the structure above a dashed line 160, including a portion of the second isolation layer 161, are subsequently removed to isolate the first electrodes 154 formed inside each cell container 126. FIG. 4 demonstrates an array of electrically isolated first electrodes 158 formed in individual cell containers 126 after the selective removal of excess conductive material.

The shortest distance for current to travel between the electrically isolated first electrodes 158 is a first surface path 159 defined between the two cell containers 126 containing the electrically isolated first electrodes 158. It is well known in the art that stray current can reach adjacent cell containers 126 via a path along the surface of the dielectric material separating the cell containers 126. Thus, an increase in the length of the surface path 159 makes it more difficult for stray currents from one cell container 126 to reach adjacent cell containers 126 and can thus bring about the desired result of reducing cell to cell shorts.

Figure 5:
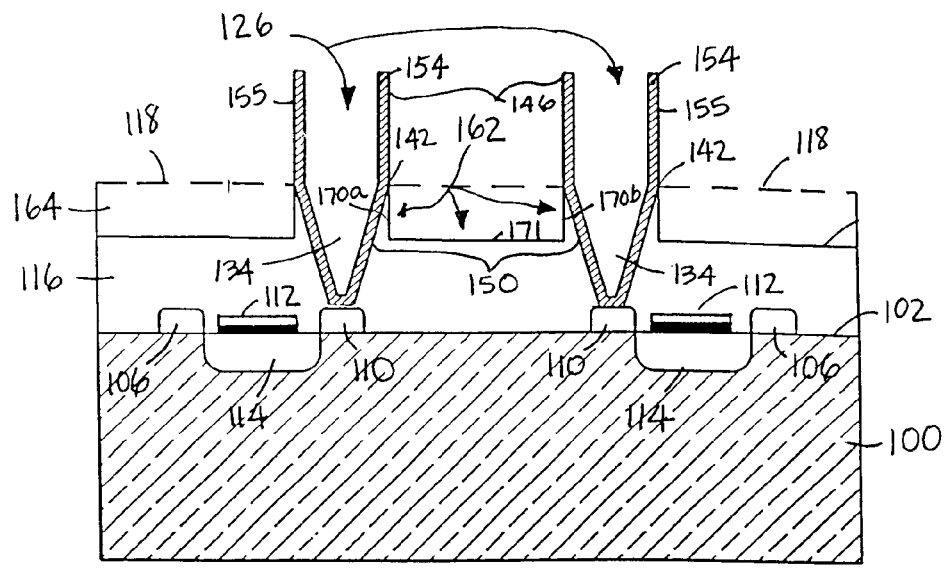
FIG. 5 is a partial schematic sectional view of the substrate of FIG. 4 which schematically illustrates the increased surface path between the electrodes of the capacitors occurring as a result of further removal of the isolation layer.

In particular, as shown in FIG. 5, the remaining portion of the second isolation layer 120 is selectively removed using well-known etching techniques exposing the first isolation region 116. A portion 164 of the first isolation layer 116 is then selectively removed using a well known dry etch technique so as to create a second surface path 162 that is longer than the already elongated physical distance 150 separating adjacent cell containers 126. In this embodiment, the second surface path 162 is comprised of two vertical surfaces 170a, 170b that are substantially non-parallel to the plane of the first surface 102 of the substrate 100 and a horizontal surface 171 that is substantially parallel to the plane of the first surface 102 linking the two vertical surfaces 170a, 170b. As illustrated in FIG. 5, the horizontal surface 171 of the second surface path 162 is preferably located beneath the transition point 142 on each of the electrodes 154.

As discussed above, the electrodes 154 conform to the inner surface of the cell containers 126. Hence, removal of the isolation layer 120 and the portion of the isolation layer 116 results in the outer electrode 154 of the cell formed within the cell container 126 including the same transition point 142 of the cell containers 126 as illustrated in FIG. 5. As is also illustrated in FIG. 5, the isolation material of the isolation layer 116 forming the vertical sections 170a, 170b of the surface path 162 contact the outer electrodes 154 at a location that is adjacent the transition point 142.

Hence, as illustrated in FIG. 5, the horizontal surface 171 is located beneath the transition point 142 and is preferably positioned within a plane that intersects the tapered region 134 of the cell containers 126 and the electrode 154 positioned therein. It will be appreciated by those skilled in the art that the vertical surfaces 170a, 170b and the horizontal surface 171 of the surface path 162 need not be exactly vertical or horizontal. The surface path 162 will be greater than the distance 150 between the adjacent cells 126 due to the horizontal surface 171 extending generally between the adjacent cell containers 126 located beneath the transition point 142 of the cell containers 126 such that the surface path 162 includes surfaces that have a component that extends in a direction perpendicular to the plane of the first surface 102 of the substrate 100.

In one embodiment, the second isolation layer 120 is completely removed by etching, using a well known etchant such as 10:1 HF, so as to expose the outer surface 118 of the first isolation layer 116 and a first surface 155 of the first electrode 154. An additional etch using a well known etchant such as HCl, HF is used to remove the portion 164 of the first isolation layer 116 so as to create the longer second surface path 162 between adjacent cell containers.

In the particular embodiment illustrated in FIG. 5, the additional length of the second surface path 162 is produced by contouring the second surface path 162 in such an a manner as to include at least one segment that is not parallel to the plane of the substrate 100. As FIG. 5 illustrates, the newly created second surface path 162 on the first isolation layer 116 between two adjacent cell containers 126 resembles a rectangular well with a substantially horizontal second segment 171 connecting a plurality of substantially vertical first segments 170a, 170b, making the overall length of the second surface path 162 substantially longer than the first physical distance 146 between the cell containers 126.

In the embodiment shown in FIG. 5, the first isolation layer 116 is anisotropically etched back to approximately 500 Angstroms using a dry etch process such as HCl, HF. Hence, the two substantially vertical first segments 170a, 170b each measuring 500 Angstroms combined with the horizontal second segment 171 measuring 1000 Angstroms form the second surface path 162 measuring 2000 Angstroms, which, in effect, is double the distance of what would otherwise occur using prior art fabrication techniques.

Moreover, the present method also allows for even further increases in the second surface path 162 by varying the etch depth and thickness of the first isolation layer 116 and the second isolation layer 120. Since stray currents move from one device to another primarily through the surface of the isolation material separating the devices, a substantial increase in the surface path as demonstrated by the illustrated embodiment will reduce the flow of stray currents between adjacent devices, and, hence, reduce cell to cell shorts.

Figure 6:
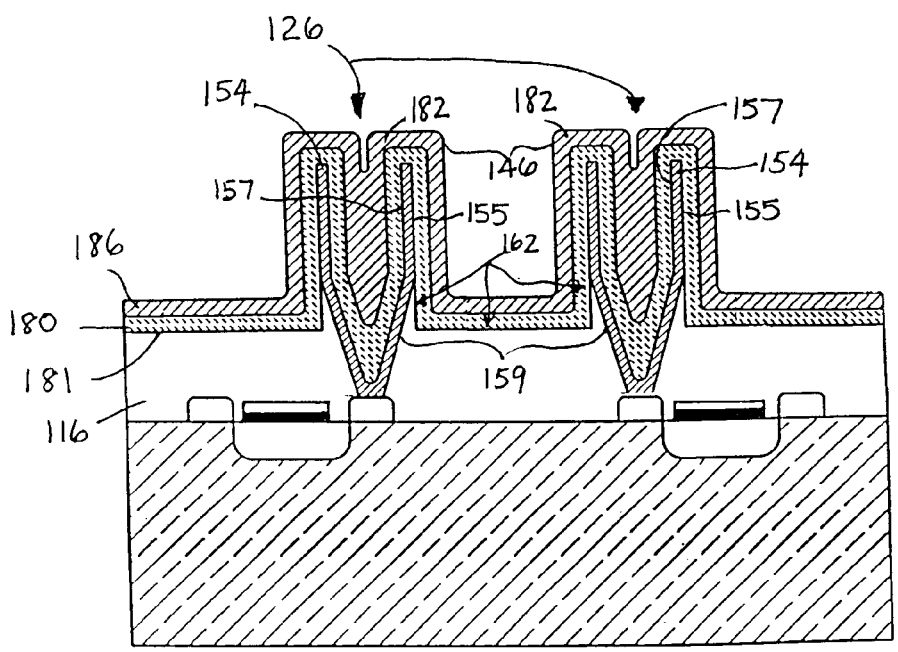
FIG. 6 is a partial schematic sectional view of the substrate in FIG. 5 which schematically illustrates the completed capacitors formed over the access devices with a longer dielectric surface path between the adjacent capacitors.

FIG. 6 illustrates exemplary DRAM memory cells formed in the containers 126. In particular, a dielectric layer 180, is formed over the exposed first surface 155 and an interior second surface 157 of the first electrode 154. In addition to the first electrode 154, the dielectric layer 180 also covers a second surface 181 of the first isolation layer 116. In one embodiment, a layer of $Si_3N_4$, a dielectric material well known in the art, is deposited onto the exposed first surface 155 and the interior second surface 157 of the first electrode 154 using a well known deposition method, such as LPCVD.

FIG. 6 further illustrates that subsequent to the formation of the dielectric layer 180, a second conductive layer 186 is deposited onto a first surface 187 of the dielectric layer 180. The second conductive layer 186 is, in this embodiment, comprised of doped silicon and is deposited using well-known deposition techniques, such as LPCVD. The second conductive layer 186 thus forms the second electrode 182 and the dielectric layer 180 is interposed between the first and second electrodes so as to form a capacitor cell such as is used in DRAM applications.

Based on the teachings of the prior art, the length of the surface path separating two adjacent cell containers has always been limited by the inherent spacing between cells. The preferred embodiment, however, not only increases the first physical distance 146 separating adjacent cell containers 126 as described in detail above, but also further elongates the first surface path 159 to a length of a second surface path 162 that is substantially longer than the first physical distance 146 between adjacent cell containers 126 as shown in FIG. 5.

Figure 7:
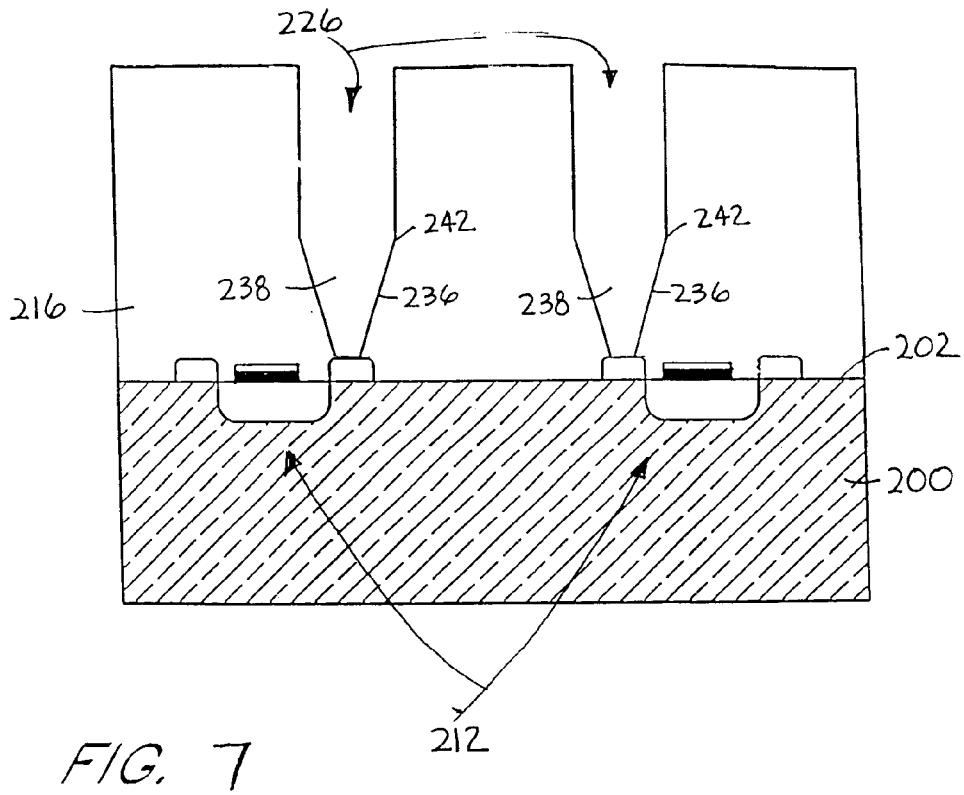
FIG. 7 is a partial schematic sectional view of the substrate of FIG. 1, wherein only a single isolation layer is positioned on the substrate and cell containers are formed therein illustrating an alternative embodiment of cell container and cell formation.

FIG. 7 shows yet another embodiment wherein an array of openings defining a plurality of cell containers 226 is formed in a single isolation layer 216 that is positioned on a first surface 202 of a substrate 200 having access devices 212 formed therein. The cell containers 226 are etched into the isolation layer 216 and the etching process preferably creates a similar tapering effect of a side wall 236 of a lower region 238 of the opening to define a similar second transition point 242. A selective etch back of the isolation layer 216 past the second transition point 242 thus creates a similarly elongated surface path between cell containers.

In one embodiment, the tapering of the lower region 238 of the cell container 226 occurs as a result of decreased exposure time of the isolation material 216 adjacent the lower region 238 of the cell container 226 being exposed to the etchant. After formation of the cell containers 226 having the tapered section in the isolation layer 216, a first electrode can be deposited in the same manner as described above. The isolation layer 216 can then be contoured, in the same manner as described above, so that a horizontal surface is formed so as to be located closer to the substrate 200 than the transition point 242. In this way, the surface path between adjacent cells formed in the cell container 226 can be increased in the same manner as described above in connection with FIGS. 5 and 6. Hence, in this embodiment there will be a tapered section of the cell container 226 from a transition point that allows for selective etch back of the isolation region to define a surface of the isolation region in a similar manner as described above that will also result in an increase in the path length between adjacent cells formed within the cell container.

Figure 8:
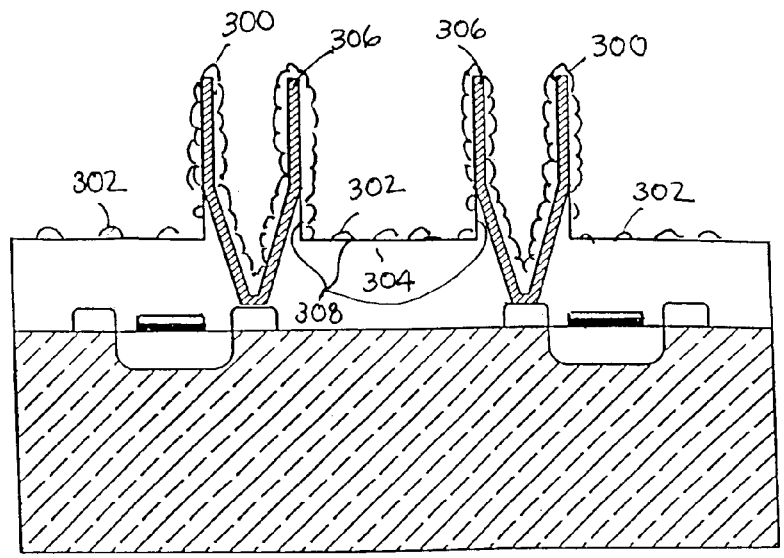
FIG. 8 is a partial schematic sectional view of the substrate of FIG. 5, wherein the electrodes are HSG textured and residual seedings are left in the space between adjacent electrodes.

In particular, the present method can be used to reduce the number of cell to cell shorts between HSG textured electrodes without compromising the textured electrode surface. As is well known in the art, the electrode texturizing process is intended to increase the electrode surface area so as to increase its capacitance. The process includes a seeding step in which nucleation sites are generated on the electrode surface and an annealing process following the seeding step resulting in a textured electrode surface 300 having a hemispherically grained morphology (HSG) as shown in FIG. 8. One drawback of the texturizing process is that it often leaves residual seeding 302 in the space 304 between the textured electrodes 306 and these residual seeding 302 can facilitate the flow of stray current between neighboring electrodes. The present method effectively addresses this particular problem by creating a longer surface path 308 between the textured electrodes 306 as shown in FIG. 8 so as to minimize the possibility of current flow between neighboring electrodes 306 caused by the residual deposits 302. The number of cell to cell shorts between HSG textured electrodes is therefore substantially reduced.

Hence, the disclosed embodiment provides a means to increase not only the physical distance between adjacent cell containers, but also the surface path between adjacent devices upon which stray current may cross. In fact, the disclosed embodiment demonstrates the forming of a surface path whose length is not limited by the physical distance between adjacent devices, which in turn provides substantially better electrical isolation between adjacent devices without having to increase the space between cells. The inventive process, therefore, offers advantages of being able to reduce the number of cell to cell shorts without consuming additional cell space.

Although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the invention. Consequently, the scope of the present invention should not be limited to the foregoing discussions, but should be defined by the appended claims.

What is claimed is:

1. An integrated circuit comprising:
a semiconductor substrate having a first surface;
at least one isolation layer formed on the first surface of the semiconductor substrate, wherein the at least one isolation layer defines a plurality of cell containers that are located within the at least one isolation layer so that at least a portion of adjacent cell containers are a first distance apart; and
a plurality of cells having a first electrode layer, an insulation layer, and a second electrode layer formed so as to extend within the cell containers, wherein the at least one isolation layer is contoured so that a surface path interconnecting adjacent cells of the plurality of cells is greater than the first distance.

2. The circuit of claim 1, wherein the plurality of cell containers comprise openings formed in the at least one isolation layer that extend downward toward the substrate and wherein the cell containers have a first region having a tapered cross-section such that the cross-sectional area of the cell container decreases in size from a transition point towards the first surface of the substrate and wherein the cell containers have a second region that extends outward from the transition point away from the first surface of the substrate.

3. The circuit of claim 2, wherein the second region of the plurality of cell containers has a substantially uniform cross-sectional area and wherein the cross-sectional area of the first region of the cell container is smaller than the cross-sectional area of the second region.

4. The circuit of claim 3, wherein the isolation layer is contoured so that the surface path interconnecting adjacent cells includes a horizontal surface that extends between adjacent cells and is located at a distance from the first surface of the substrate so that the horizontal surface is closer to the first surface of the substrate than the transition point.

5. The circuit of claim 4, wherein the isolation layer is contoured so that a substantially vertical surface of the isolation region interconnects each cell to the horizontal surface so that the vertical surface increases the length of the surface path between the adjacent cells.

6. The circuit of claim 4, wherein the plurality of cells comprise capacitors that have the first electrode positioned in contact with the inner walls of the cell containers.

7. The circuit of claim 6, wherein the capacitor further includes the insulation layer positioned on the first electrode and the second electrode positioned on the insulation layer.

8. The circuit of claim 7, wherein the first and second electrodes are textured.

9. An integrated circuit comprising:
a semiconductor substrate having a first surface;
at least one isolation layer formed on the first surface of the semiconductor substrate, wherein the at least one isolation layer defines a plurality of cell containers that are located within the at least one isolation layer so that adjacent cell containers are at least a first distance apart and wherein the plurality of cell containers have a first region of a first cross-sectional area located proximal the first surface of the semiconductor substrate and a second region of a second cross-sectional area greater than the first cross-sectional area located distal from the first surface of the semiconductor substrate;
a plurality of cells formed in the plurality of cell containers wherein the outer boundary of the cells conform to the inner surfaces of the cell containers and wherein the at least one isolation layer is formed so that an outer surface of the at least one isolation layer is located so as to be in a plane that intersects the first region of the cell container such that a surface path interconnecting the portion of the cells in the second region of the adjacent cell containers includes at least one path length extending in a direction so as to intercept the outer surface of the at least one isolation layer.

10. The circuit of claim 9, wherein the at least one isolation layer is formed so that the surface path between adjacent cells in the container includes two vertical paths extending in a direction substantially perpendicular to the first surface of the semiconductor substrate.

11. The circuit of claim 10, wherein the plurality of cell containers are formed in the at least one isolation layer so that the first region has a substantially uniform cross-sectional area and the second region has a tapered cross-sectional area that decreases from a transition point between the first and the second regions as the cell container approaches the first surface of the semiconductor substrate.

12. The circuit of claim 11, wherein the at least one isolation layer is formed so that the first surface of the at least one isolation layer is located between the transition point and the first surface of the semiconductor surface.

13. The circuit of claim 12, wherein the plurality of cells comprise capacitors that have a first electrode positioned in contact with the inner walls of the cell containers.

14. The circuit of claim 13, wherein the capacitor further includes an insulation layer positioned on the first electrode and a second electrode positioned on the insulation layer.

15. The circuit of claim 14, wherein the first and second electrodes are texturized.

* * * * *